United States Patent [19]
Snyder et al.

[11] Patent Number: 5,563,596
[45] Date of Patent: Oct. 8, 1996

[54] ARRAYED ANALOG-TO-DIGITAL CONVERTERS

[75] Inventors: Robert E. Snyder, Andover; Bruce C. Levens, Natick, both of Mass.

[73] Assignee: Steinbrecher Corporation, Burlington, Mass.

[21] Appl. No.: 258,478

[22] Filed: Jun. 10, 1994

[51] Int. Cl.⁶ .................................................. H03M 1/12
[52] U.S. Cl. .................................... 341/131; 341/155
[58] Field of Search .................................. 341/131, 144, 341/155, 166, 111

[56] References Cited

U.S. PATENT DOCUMENTS 4,901,265  2/1990  Kerr et al. ........................... 364/721
5,267,260  11/1993  Lee .................................... 375/1
5,373,533  12/1994  Hayashihara et al. ............... 375/334

OTHER PUBLICATIONS

Ghausi, M. S., "Electronic Circuits", Van Nostrand Reinhold Co., New York, 1971, pp. 312 to 316.

*Primary Examiner*—Brian K. Young
*Attorney, Agent, or Firm*—Fish & Richardson P.C.

[57] ABSTRACT

An analog signal is converted to a digital signal by two analog-to-digital converters. The first converter digitizes the analog signal to produce a first series of samples of the signal. The second converter digitizes the analog signal after it has been shifted in phase by 180 degrees to produce a second series of samples. A digital adder then subtracts the second series of samples from the first series to produce the digital signal.

13 Claims, 1 Drawing Sheet

ARRAYED ANALOG-TO-DIGITAL CONVERTERS

BACKGROUND

This invention relates to converting an analog signal to a digital signal.

Analog-to-digital converters sample an input analog waveform at discrete time intervals to produce a series of samples representing the analog waveform. The converters then quantize and encode each sample in a preset number of bits. The digital output of the converters consists of the series of encoded samples.

The converters typically introduce nonlinear distortion into their output by generating harmonics of their respective input waveforms. In addition, the converters have a "quantization noise floor" indicating a lowest input signal level the converters can sample accurately. The quantization error is a function of the number of bits encoding each sample in the digital output of the converters.

SUMMARY OF THE INVENTION

In general, in one aspect, the invention features converting an analog input signal to a digital output signal with two analog-to-digital converters. The first converter digitizes the input signal to produce a first series of samples. The second converter digitizes the input signal after it has been shifted in phase by 180 degrees to produce a second series of samples. A digital adder then subtracts the second series of samples from the first series to produce the digital output signal.

Embodiments of the invention may include the following features. A 180 degree four-port hybrid receives the input signal in a difference port. The first converter receives the input signal from a first output port of the hybrid, while the second converter receives the input signal shifted in phase by 180 degrees from a second output port of the hybrid. A clock sends a clock signal to the first converter and to the second converter to control the rate at which the first converter samples the input signal to produce the first series of samples, and the rate at which the second converter samples the signal shifted in phase by 180 degrees to produce the second series of samples.

In addition, a noise source connected to a sum port of the hybrid injects noise into the first converter and into the second converter in phase.

Among the advantages of the invention are the following.

The conversion scheme with all the features described above provides a 3 dB reduction in quantization noise floor over either converter when used alone. This is accomplished without having the noise signal contaminate the output signal. In addition, nonlinear distortion in the output signal is reduced by canceling even-order harmonics of the input signal generated by each converter. The conversion scheme thus provides a performance superior to that of any individual converter it may employ.

Other features and advantages of the invention will become apparent from the following description and from the claims.

DESCRIPTION

Figure 1:
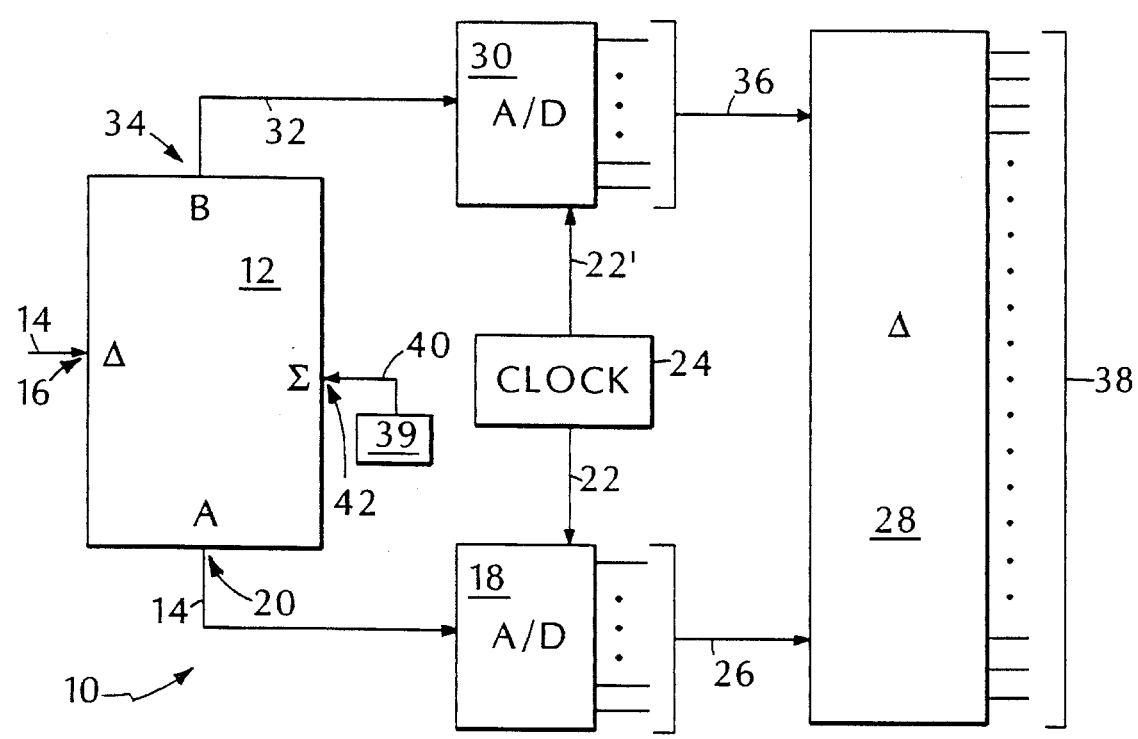
FIG. 1 is a block diagram of a circuit performing analog to digital conversion, according to the invention.

Referring to FIG. 1, A/D circuit 10 has a four-port, 180 degree hybrid 12 receiving an input analog waveform 14 at its difference port 16. A first analog-to-digital converter 18 receives the input waveform 14 from an "A" port 20 of the hybrid. The first converter digitizes the input waveform 14 by first sampling the waveform 14 at a rate indicated by a clock signal 22 from a connected clock 24. The converter then quantizes and encodes each sample of the input waveform before sending the resulting series of samples to a digital adder 28.

A second, identical analog-to-digital converter 30 receives a shifted waveform 32 from a "B" port 34 of the hybrid. The shifted waveform 32 consists of the input waveform 14 after it has been shifted in phase by 180 degrees in the hybrid. The second converter digitizes the shifted waveform 32 by first sampling the waveform 32 at the rate indicated by an identical clock signal 22' from the connected clock 24. The second converter then quantizes and encodes each sample of the shifted waveform before sending the resulting series of samples 36 to the digital adder 28.

The arrayed A/D converters 18, 30 may each introduce various types of nonlinearities into the series of samples 26, 36 at their outputs. For example, the A/D converters may each produce power-series type memoryless nonlinearities. As a result, the first series of samples ($V_1[n]$) 26 of the input waveform ($V_s$) 14 includes samples of the input waveform ($V_s[n]$) along with its harmonics:

$$V_1[n] = k_1 V_s[n] + k_2 V_s[n]^2 + k_3 V_s[n]^3 + \ldots \quad (1)$$

where $k_1, k_2, \ldots$, are constants representing gains introduced by the converter.

The second series of samples ($V_2[n]$) 36 of the shifted waveform ($-V_s$) 32 includes samples of the shifted waveform ($-V_s[n]$) along with its harmonics:

$$V_2[n] = -k_1 V_s[n] + k_2 V_s[n]^2 - k_3 V_s[n]^3 k_4 V_s[n]^4 + \ldots \quad (2)$$

Because the second A/D converter is of identical design to the first converter, the gains ($k_1, k_2, \ldots$) produced by both converters are nearly equal.

The digital adder 28 produces a series of samples ($V_{out}[n]$) 38 at its output by subtracting each sample in the second series ($V_2$) from a corresponding sample in the first series ($V_1$):

$$V_{out}[n] = V_1[n] - V_2[n] = 2k_1 V_s[n] + 2k_3 V_s[n]^3 + 2k_5 V_s[n]^5 + \ldots \quad (3)$$

The output 38 of the A/D circuit 10 is thus a scaled and digitized representation of the input waveform ($V_s[n]$) with the only added distortion terms being the odd-order harmonics. In particular, the second order distortion term ($V_s[n]^2$) has been removed from the output to provide a significant improvement in performance over either A/D converter 18, 30 when used alone.

In another example, each A/D converter may introduce a nonlinearity with memory into the series of samples at its output. These nonlinearities may arise from, for example, varactor capacitance and aperture modulation in the sample and hold portion of each A/D converter. The output of the identical A/D converters in this case are of the form:

$$V_1[n] = k_1 V_s[n] + k_2 V_s[n] \frac{\partial V_s[n]}{\partial t} + \ldots \quad (4)$$

$$V_2[n] = -k_1 V_s[n] + k_2 V_s[n] \frac{\partial V_s[n]}{\partial t} + \ldots \quad (5)$$

where $k_1, k_2, \ldots$ are positive constants. The adder thus produces a scaled input waveform $(2k_1 V_s[n])$ and cancels the second order harmonic $(k_2 v_s[n] \partial V_s/\partial t)$ (and any other even-order harmonics) at its output.

The quantization noise floor of the A/D circuit 10 is whitened by a source 39 injecting a noise dither signal 40 into a sum port 42 of the hybrid 12. The source thus "dithers" each A/D converter 30, 18, i.e. it causes a least significant bit in the series of samples at the output of each converter to toggle randomly. This smooths the quantization noise in the output of the converters in the frequency domain.

The noise source 40 can be implemented in a variety of known ways to provide either relatively broadband or narrowband noise. For example, the noise can be generated by a shift register that is clocked at a sub multiple (for example, half or quarter) of the A/D clock 24 rate. The shift register has XOR or XNOR gates feeding back into various points of the shift register, followed by a finite impulse response (FIR) filter. The FIR filter typically has a resistor attached to each shift register stage, and is connected to an LC filter through an op amp. The choice of resistors determines the shape of the FIR filter. Negative coefficients can be generated by inverting the output of the shift register stage. Other types of noise generators include, for example, a counter stepping through a programmable read-only memory (PROM) loaded with a pseudorandom sequence followed by a D/A converter and a filter, or a noisy diode plus level control circuitry.

The hybrid adds the dither signal 40 without a phase change to both the input waveform 14 at the A port 20 and the shifted waveform 32 at the B port 34. The first converter 18 and the second converter 30 thus receive an identical, in-phase noise dither signal from the A port and the B port of the hybrid, respectively. The first converter samples the dither signal from the B port to produce a digitized dither component in the first series of samples 26 at its output. The second converter similarly samples the dither signal from the A port to generate an identical digitized dither component in the second series of samples 36 at its output. The digital adder 28 removes the identical dither components from the output 38 of the circuit by subtracting the second series 36 from the first series 26. The A/D circuit 10 thus allows each A/D converter 18, 30 to be "dithered" without the output signal being contaminated with a digitized dither signal to the output 38 of the circuit.

Each A/D converter also typically produces harmonics of the combined dither signal and the waveform arriving at its input. However, substantially only the odd-order harmonics of the waveform survive at the output 38 of the circuit, as described above.

The dither signal improves the performance of the A/D converters by ensuring that, to an excellent approximation, the quantization noise components distorting the output of each A/D converter are mutually independent as well as individually white. As a result, when the series of samples 26, 36 from each converter are added to one another, the correlated input signals $(k_1 V_s, k_2 V_s)$ reinforce, while the independent quantization noise components add as orthogonal vectors. This causes a 3 dB reduction in the quantization noise floor of the A/D circuit relative to full scale.

The reduction in the quantization noise floor will not be achieved if the dither signal at the inputs of the converters causes an increase in the quantization noise floor of the converters. This may occur if the quantization noise floor is sensitive to the signal level at the input of the converters. It is therefore essential that the quantization noise floor of each A/D converter be independent of the signal level at the input of the converters. An example of such a converter is the AD9032 A/D converter available from Analog Devices in Norwood, Mass.

Dither large enough to cause only the least significant bit to toggle is sufficient to smooth out the quantization noise in each converter. However, further performance improvements are achieved with a significantly larger dither signal amplitude. The A/D circuit 10 facilitates the use of large dither signals, since the adder 28 removes the dither components corresponding to the dither signals from each converter 18, 30. A large digitized dither signal therefore does not contaminate the output 38 of the circuit.

The A/D circuit is tolerant of small differences in the gains produced by each A/D converter, e.g. a small difference in the gains (e.g., about 1 dB) maintains a large reduction (e.g., about 10 dB) in both the even-order harmonics and dither components at the output 38 of the adder. As a result, a variable resistor to adjust the gains of the A/D converters is generally not needed in the A/D circuit.

Other embodiments are within the following claims.

For example, if identical A/D converters are not available, a matched pair of converters may be chosen. The converters are matched by providing a fairly high level, high frequency signal to the converters and checking that the harmonics produced by each converter have equal amplitudes. However, some performance improvement will be provided even when the converters are not exactly matched.

In addition, the phase-shifted input signal may be supplied to the A/D converter from a variety of circuits other than the hybrid, e.g. other transformers, op amps or resistive circuits may be used.

What is claimed is:

1. Apparatus for converting an analog signal to a digital signal, comprising a first analog-to-digital converter digitizing the analog signal to produce a first series of samples of the analog signal, a second analog-to-digital converter receiving the analog signal after the analog signal has been shifted in phase by 180 degrees, the second analog-to-digital converter digitizing the analog signal shifted in phase by 180 degrees to produce a second series of samples, and a digital adder connected to receive the first series and the second series of samples, the adder subtracting the second series from the first series to produce the digital signal.

2. The apparatus of claim 1 further comprising a 180 degree four-port hybrid receiving the analog signal in a difference port, wherein the first converter is connected to receive the analog signal from a first output port of the hybrid, the second converter being connected to receive the analog signal shifted in phase by 180 degrees from a second output port of the hybrid.

3. The apparatus of claim 1 further comprising a clock connected to send a clock signal to the first converter and to the second converter, the clock signal controlling a rate at which the first converter and the second converter respectively digitize the analog signal and the analog signal shifted in phase by 180 degrees.

4. The apparatus of claim 1 further comprising a noise source connected to inject noise into the first analog-to-digital converter.

5. The apparatus of claim 1 further comprising a noise source connected to inject noise into the second analog-to-digital converter.

6. The apparatus of claim 4 wherein the noise source is further connected to inject the noise into the first analog-to-digital converter, the noise injected into the first converter being in-phase with the noise injected into the second converter.

7. The apparatus of claim 2 wherein a noise source is connected to a sum port of the hybrid.

8. A method for converting an analog signal to a digital signal, comprising digitizing the analog signal to produce a first series of samples, shifting the analog signal in phase by 180 degrees to produce a shifted signal, digitizing the shifted signal to produce a second series of samples, and subtracting the second series from the first series to produce the digital signal.

9. The method of claim 8 wherein the analog signal and the shifted signal are digitized by periodically sampling each signal at an identical sample rate.

10. The method of claim 8 further comprising adding noise to the analog signal to produce a dithered analog signal before digitizing the dithered analog signal to produce the first series of samples.

11. The method of claim 8 further comprising adding noise to the shifted signal prior to digitizing the shifted signal.

12. The method of claim 10 further comprising adding noise to the shifted signal prior to digitizing the shifted signal.

13. The method of claim 12 wherein the noise added to the shifted signal is in phase with the noise added to the analog signal.

* * * * *